(12) United States Patent
Houston

(10) Patent No.: US 6,362,117 B1
(45) Date of Patent: Mar. 26, 2002

(54) METHOD OF MAKING INTEGRATED CIRCUIT WITH CLOSELY SPACED COMPONENTS

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/491,942

(22) Filed: Jan. 26, 2000

Related U.S. Application Data

(63) Continuation-in-part of application No. 09/368,387, filed on Aug. 4, 1999.
(60) Provisional application No. 60/171,770, filed on Dec. 22, 1999, and provisional application No. 60/095,327, filed on Aug. 4, 1998.

(51) Int. Cl.$^7$ .................. H01L 21/338; H01L 21/336; H01L 21/3205
(52) U.S. Cl. .............. 438/947; 438/183; 438/185; 438/197; 438/301; 438/303; 438/305; 438/306; 438/587; 438/595; 438/597
(58) Field of Search ................. 438/947, 197, 438/585–587, 595, 597, 637–640, 672, 675, 183–185, 301, 303, 305, 306

(56) References Cited

U.S. PATENT DOCUMENTS

| | | | | | |
|---|---|---|---|---|---|
| 5,640,032 A | * | 6/1997 | Tomioka | ..................... | 257/316 |
| 5,670,427 A | * | 9/1997 | Cho | ........................... | 438/669 |
| 5,892,707 A | * | 4/1999 | Noblee | ...................... | 365/149 |
| 6,037,253 A | * | 3/2000 | Chung | ....................... | 438/639 |
| 6,271,095 B1 | * | 8/2001 | Yu | ............................. | 438/302 |

* cited by examiner

*Primary Examiner*—Ha Tran Nguyen
(74) *Attorney, Agent, or Firm*—Pedro P. Hernandez; W. James Brady, III; Frederick J. Telecky, Jr.

(57) ABSTRACT

An integrated circuit (10, 60, 110, 210) is fabricated according to a method which includes the steps of providing a structure (12, 112, 212) having a top surface (13, 113, 213), and forming spaced first and second sections (16–18, 67–69, 72–73, 126–127, 231–232) on the top surface. The first and second sections have side surfaces (21–26, 81–88, 131–134, 241–244) thereon. A respective sidewall (31–36, 91–98, 141–144, 251–254) with a sublithographic thickness is formed on each side surface. Then, a further section (42A–42D, 101A–101D, 152, 268) is formed in the region between the sidewalls on the first and second sections, for example by introducing a selected material between those sidewalls, and by then removing any portion of the selected material which is higher than the upper ends of the sidewalls.

8 Claims, 6 Drawing Sheets

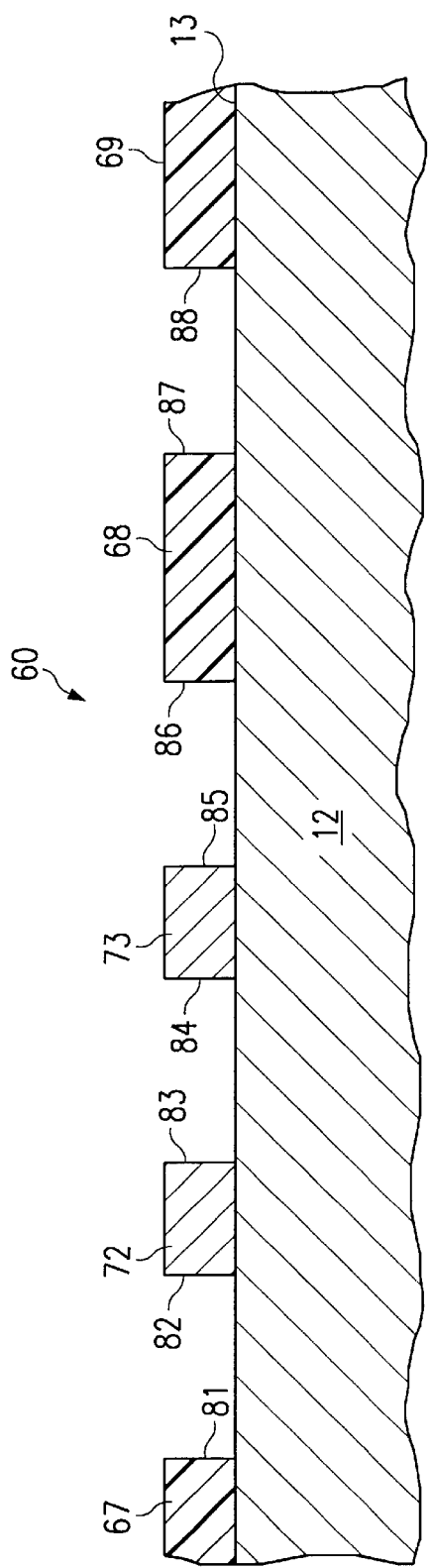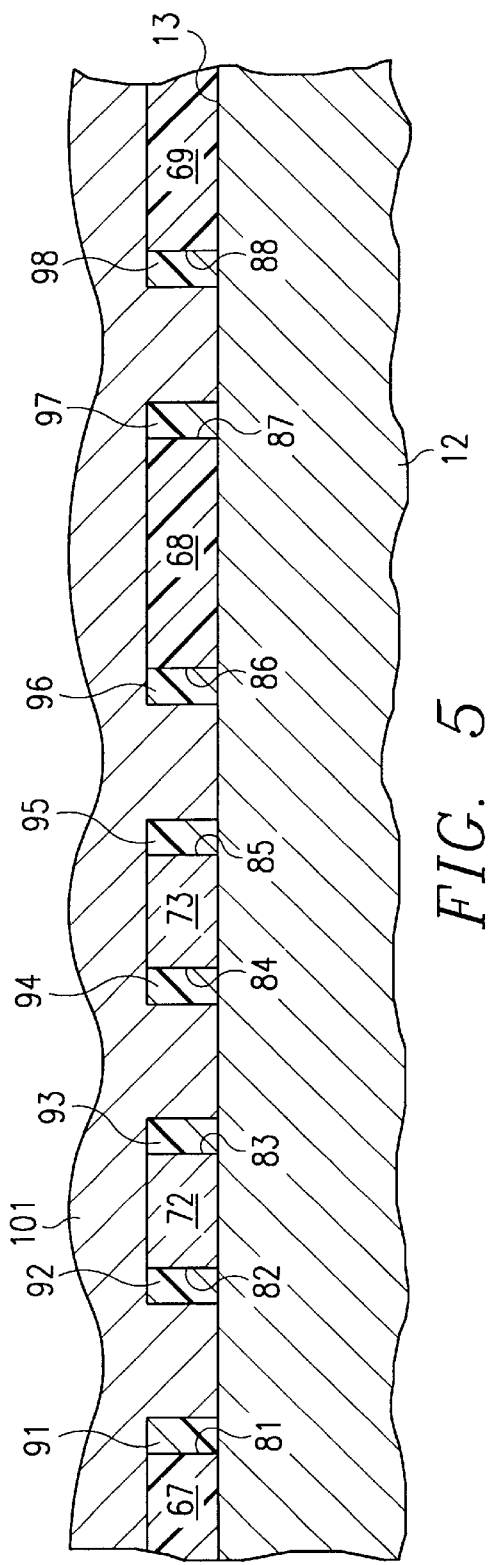

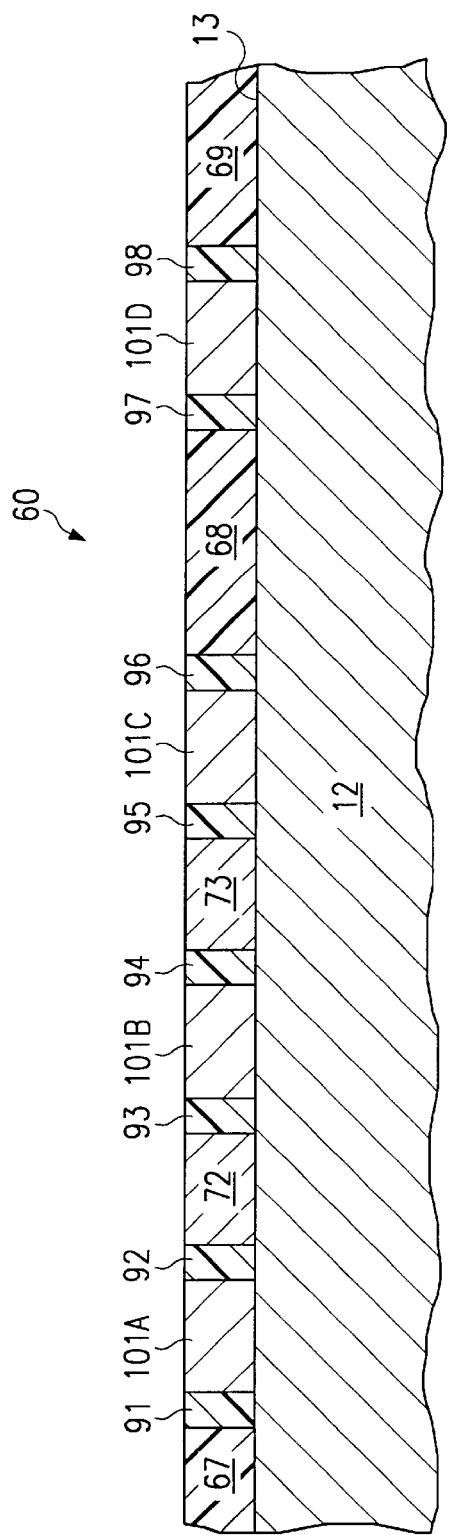
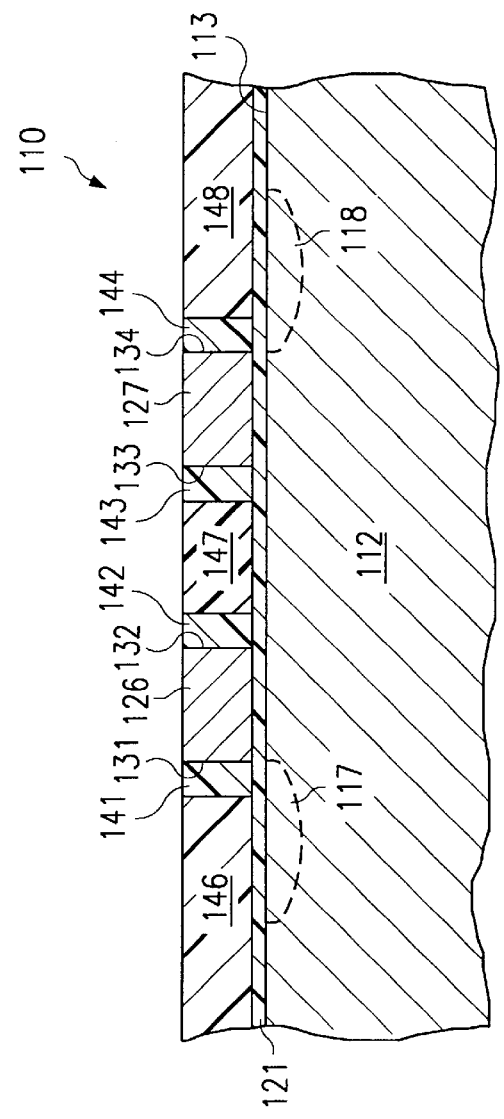
FIG. 6
FIG. 7

METHOD OF MAKING INTEGRATED CIRCUIT WITH CLOSELY SPACED COMPONENTS

This application claims the priority under 35 U.S.C. §119 of provisional application Nos. 60/095,327 and 60/171,770 respectively filed Aug. 4, 1998 and Dec. 22, 1999, and is a continuation-in-part of U.S. Ser. No. 09/368,387 filed Aug. 4, 1999 and entitled "Asymmetrical Devices for Short Gate Length Performance with Disposable Sidewall".

CROSS-REFERENCE TO RELATED APPLICATIONS

The present application is related to U.S. Ser. No. 09/349,626 filed Jul. 8, 1999 and entitled "Selectively Increased Interlevel Capacitance"; U.S. Ser. No. 09/098,188 filed Jun. 16, 1998 and entitled "Process for Defining Ultra-Thin Geometries"; and U.S. Ser. No. 09/697,922, filed Oct. 26, 2000 and entitled "Method for Controlling an Implant Profile in the Channel of a Transistor".

TECHNICAL FIELD OF THE INVENTION

This invention relates in general to fabrication of an integrated circuit and, more particularly, to fabrication of an integrated circuit having components which are very closely spaced.

BACKGROUND OF THE INVENTION

When fabricating an integrated circuit, it is often desirable to have certain components of the integrated circuit spaced from each other by distances which are relatively small. For example, there are situations where several parallel lines include two groups of lines which are interleaved and which respectively carry two power supply voltages, or respectively carry a power supply voltage and a system ground. In situations of this type, it can be advantageous to have a very close spacing between the lines, for example to obtain a high capacitive coupling effect which filters out noise. As another example, where several transistors are coupled in series, it can be advantageous to have the gate structures for the transistors arranged with very close spacing, in order to reduce series resistance, and in order to reduce the capacitance at nodes between the transistors. Yet another consideration, which comes up in many applications, is that reduction of the spacing between components would result in reduction of the overall size or area of the integrated circuit, which can be advantageous.

As a practical manner, however, there are limitations on the capability to fabricate component parts of an integrated circuit which are very closely spaced. For example, there are mechanical considerations which limit the ability to achieve close alignment tolerances between successive lithographic steps that are involved in the fabrication of an integrated circuit. Moreover, where close lithographic alignment tolerances are used in an attempt to achieve close spacing, it can necessitate a level of precision which increases the overall cost of the fabrication process.

In addition, there are situations in which the degree of spacing that can be achieved using existing lithographic techniques is less than what would be desirable. For example, there are situations in which it would be desirable to have component parts of an integrated circuit spaced by distances which are sublithographic, or in other words distances which involve considerations that exceed existing lithographic capabilities.

Thus, while there are existing techniques for fabricating integrated circuits so that certain component parts are somewhat closely spaced, at least in terms of existing lithographic capabilities, and while these known techniques have been generally adequate for their intended purposes, they have not been satisfactory in all respects. In this regard, there are situations in which it would be desirable to fabricate component parts that are relatively closely spaced, but through the use of techniques which do not necessitate the level of precision and cost associated with existing techniques that approach the limits of lithographic capabilities. Further, it would be desirable for certain applications to be able to fabricate component parts within an integrated circuit which are spaced by a distance smaller than can be achieved by known techniques, including sublithographic distances.

SUMMARY OF THE INVENTION

From the foregoing, it may be appreciated that a need has arisen for an integrated circuit, and a method of making it, where components of the integrated circuit are very closely spaced, and in some cases by distances which are sublithographic.

According to a first form of the present invention, this need is met by a method of making an integrated circuit, and by an integrated circuit made according to the method, where the method includes: providing a structure having a top surface; forming spaced first and second sections on the top surface, the first and second sections respectively having first and second side surfaces thereon which face each other; forming a first sidewall on the first side surface; and forming a second sidewall on the second side surface. A third section is formed between the first and second sidewalls, including the steps of introducing a selected material between the first and second sidewalls, and removing any portion of the selected material which is higher than upper ends of the first and second sidewalls.

According to a different form of the present invention, the need is met by an integrated circuit which includes: a structure having a top surface; spaced first and second sections disposed on the top surface, and a third section disposed on the top surface between the first and second sections, the first and third sections being spaced from each other by a distance which is sublithographic, and the second and third sections being spaced from each other by a distance which is sublithographic. A first sidewall is disposed between the first and third sections, and a second sidewall is disposed between the second and third sections.

BRIEF DESCRIPTION OF THE DRAWINGS

A better understanding of the present invention will be realized from the detailed description which follows, taken in conjunction with the accompanying drawings, in which:

FIGS. 4–6 are diagrammatic sectional side views of an alternative embodiment of the integrated circuit of FIGS. 1–3, depicting respective successive stages during it fabrication according to an alternative form of the method utilized to fabricate the integrated circuit of FIGS. 1–3;

FIGS. 7–11 are diagrammatic sectional side views of still another alternative embodiment of the integrated circuit of FIGS. 1–3, depicting respective successive stages during its fabrication according to still another form of the method utilized to fabricate the integrated circuit of FIGS. 1–3.

DETAILED DESCRIPTION OF THE INVENTION

Figure 1:
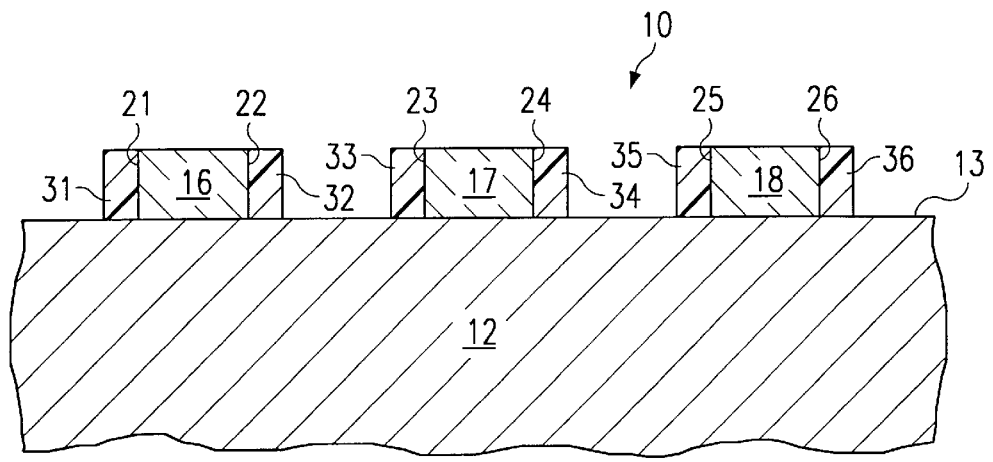
FIGS. 1–3 are each a diagrammatic sectional side view of an integrated circuit, and show the integrated circuit at respective successive stages during its fabrication according to a method which embodies the present invention.
Figure 2:
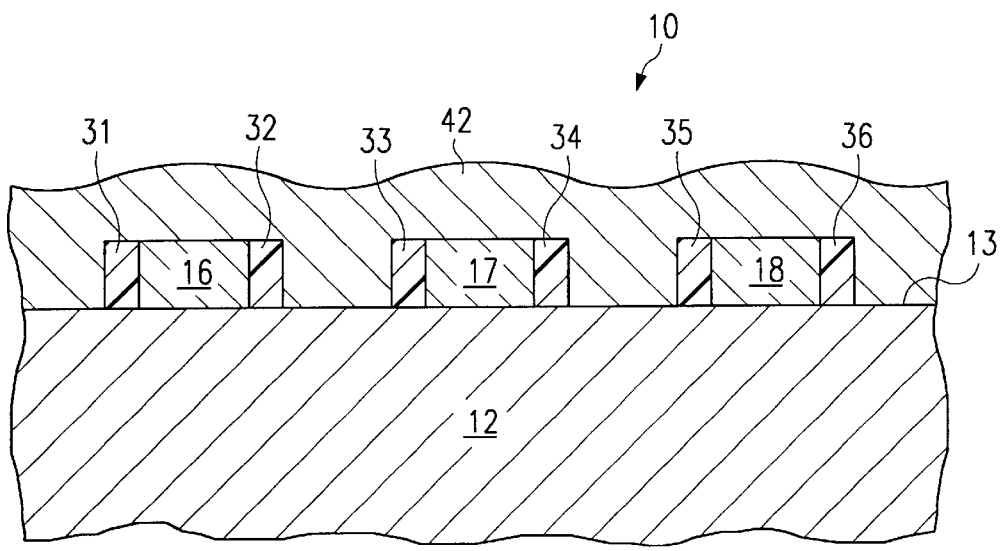
Figure 3:
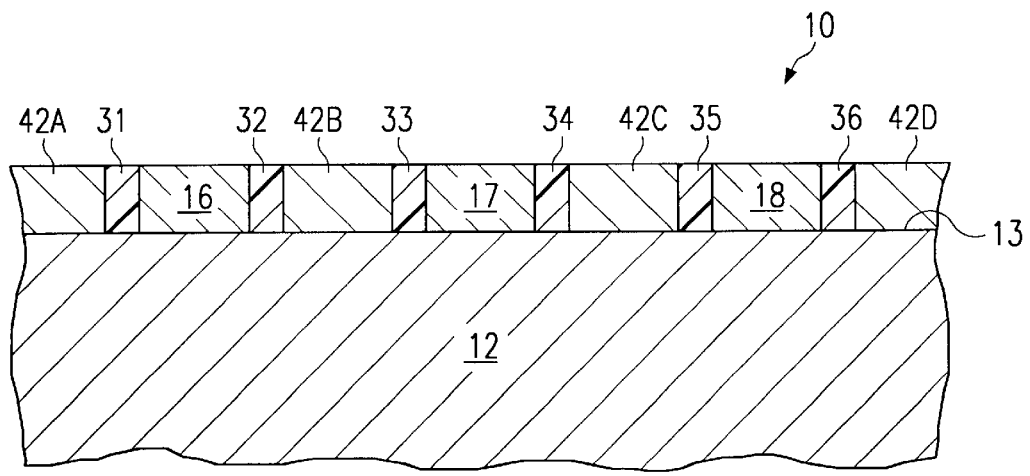

FIGS. 1–3 are each a diagrammatic sectional side view of an integrated circuit 10 which embodies features of the present invention. FIGS. 1–3 show the integrated circuit 10 at respective successive stages during its fabrication according to a method which embodies the present invention.

The integrated circuit 10 includes a structural portion 12 having thereon an upwardly facing top surface 13. In: the disclosed embodiment of FIGS. 1–3, the structural portion 12 includes a semiconductor substrate having several circuit components such as transistors formed thereon, although the substrate and components are not separately depicted in FIGS. 1–3. Alternatively, however, the structural portion 12 could have a variety of other configurations that are all compatible with the present invention.

With reference to FIG. 1, a plurality of sections 16–18 are fabricated on the top surface 13, and are each made of a conductive material. In the disclosed embodiment of FIGS. 1–3, the sections 16–18 are each an elongate strip of conductive material which extends in a direction perpendicular to the plane of FIG. 1. The conductive sections 16–18 thus extend parallel to each other. The conductive sections 16–18 are formed by depositing a layer of a conductive material such aluminum on the top surface 13, and by then carrying out a patterned etch using known techniques in order to remove unwanted portions of the aluminum layer, thereby leaving the sections 16–18 which are shown in FIG. 1. The section 16 has side surfaces 21 and 22 on opposite sides thereof, the section 17 has side surfaces 23 and 24 on opposite sides thereof, and the section 18 has side surfaces 25 and 26 on opposite sides thereof. The sides surfaces 22 and 23 face each other, and the side surfaces 24 and 25 face each other.

Although the sections 16–18 in the disclosed embodiment of FIG. 1 are formed by a patterned etch of a conductive layer, they could alternatively be formed by a damascene process. For example, such a damascene process could be carried out by applying to the surface 13 a layer of a material such as silicon dioxide, etching trenches in the layer where the sections 16–18 are to be located, depositing a layer of a conductive material so as to fill the trenches, planarizing the conductive material so as to remove portions thereof other than the portions in the trenches, and then etching away the silicon dioxide layer.

Next, and as shown in FIG. 1, respective sidewalls 31–36 are formed on the respective side surfaces 21–26, where each of the sidewalls 31–36 has a lower edge which engages the top surface 13. The sidewalls 31–36 may be formed in a known manner, for example by depositing a layer of an insulating material such as a nitride over the top of the device 10, and then doing an appropriate vertical etch so as to leave only selected portions of the material which define the respective sidewalls 31–36. Although the sidewalls 31–36 are made of a nitride material in the embodiment of FIGS. 1–3, they could alternatively be made of some other material, such as an intrinsic polysilicon material, or an organic material such as a polyamide.

In the embodiment of FIGS. 1–3, the sidewalls 31–16 each have a width or thickness, or in other words a horizontal dimension in FIG. 1, which is sublithographic. Known techniques for forming the sidewalls 31–16, such as the technique mentioned above, allow each of the sidewalls 31–36 to be formed with very accurate control of its width or thickness, even where the width or thickness is sublithographic.

Subsequently, with reference to FIG. 2, a layer 42 of a conductive material such as copper is deposited over the top of the device 10. Then, the layer 42 is planarized so as to remove portions of the layer 42 which are above the tops of the sidewalls 31–36. This planarization can be effected using a known planarization technique, such as planarization by chemical mechanical polishing (CMP), or planarization by etching.

After planarization, the device 10 appears as shown in FIG. 3,. where the sections 42A–42D represent the portions of the conductive layer 42 (FIG. 2) which remain after planarization. The conductive section 42B is disposed between sidewalls 32–33, the conductive section 42C is disposed between sidewalls 34–35, the conductive section 42A is disposed on a side of the sidewall 31 opposite from the section 16, and the conductive section 42D is disposed on a side of the sidewall 36 opposite from the section 18. As noted above, the sidewalls 31–36 each have a width or thickness which is sublithographic. Consequently, it will be recognized that conductive sections 42A and 16 are spaced by a distance which is sublithographic, conductive sections 16 and 42B are spaced by a distance which is sublithographic, conductive sections 42B and 17 are spaced by a distance which is sublithographic, conductive sections 17 and 42C are spaced by a distance which is sublithographic, conductive sections 42C and 18 are spaced by a distance which is sublithographic, and conductive sections 18 and 42D are spaced by a distance which is sublithographic. In the disclosed embodiment of FIGS. 1–3, the conductive sections 16–18 all carry a first supply voltage, and the conductive sections 42A–42D all carry a second supply voltage. The conductive sections 16–18 carrying the first supply voltage are thus interleaved with the conductive sections 42A–42D carrying the second supply voltage, and there is a high degree of capacitive coupling between adjacent conductive sections, due to the close, sublithographic spacing. Alternatively, conductive sections 16–18 may carry a supply voltage, and conductive sections 42A–42D may carry a system ground, again with high capacitive coupling between adjacent conductive sections.

In FIG. 3, the conductive sections 16–18 and 42A–42D can each be electrically coupled in a known manner to runs or circuitry within the structural portion 12, for example through vias which are not illustrated, and which each extend downwardly into the portion 12 from a respective one of the sections 16–18 and 42A–42D. Similarly, if an additional level of metalization is fabricated above the structure of the integrated circuit 10 which is shown FIG. 3, the conductive sections 16–18 and 42A–42D can each be electrically coupled in a known manner to runs or circuitry in the added structure, for example through the use of not-illustrated vias that each extend upwardly from a respective one of the conductive sections 16–18 and 42A–42D.

It will be recognized that, if the conductive sections 16–18 are positioned so as to be relatively close to each other, in particular so that the distance between the sidewalls 32 and 33 in FIG. 1 is sublithographic, and so that the distance between the sidewalls 34 and 35 is sublithographic, the width of the conductive sections 42B and 42C will be sublithographic.

FIGS. 4–6 are each a diagrammatic sectional side view of an integrated circuit 60 which is an alternative embodiment of the integrated circuit 10 of FIGS. 1–3. The integrated circuit 60 is made according to an alternative embodiment of the method used to make the integrated circuit 10 of FIGS. 1–3. FIGS. 4–6 show the integrated circuit 60 at respective successive stages during its fabrication.

The integrated circuit 60 includes a structural portion 12 which has a top surface 13, and which is equivalent to the structural portion 12 shown in FIGS. 1–3. Three spaced sections 67–69 are formed on the top surface 13, and in the disclosed embodiment of FIGS. 4–6 are made of a dielectric material such as silicon dioxide. The sections 67–69 are created by depositing a layer of a dielectric material over the top of the device 10, and then carrying out a patterned etch using known techniques, in order to remove unwanted portions of the layer, thereby leaving only selected portions such as those shown at 67–69 in FIG. 4.

Subsequently, two spaced conductive sections 72–73 are formed on the top surface 13 between the dielectric sections 67 and 68. The conductive sections 72–73 are formed by depositing over the top of the device 60 a layer of a conductive material such aluminum, and then carrying out a patterned etch using known techniques in order to remove unwanted portions of the conductive layer, thereby leaving sections such as those shown at 72–73. In the disclosed embodiment of FIGS. 4–6, the sections 72–73 are each an elongate strip of conductive material which extends perpendicular to the plane of FIG. 4. The conductive sections 72–73 extend parallel to each other. The dielectric sections 67–69 and the conductive sections 72–73 each have at least one side surface thereon, as shown at 81–88 in FIG. 4.

Although the conductive sections 72–73 in the disclosed embodiment are formed by a patterned etch, as explained above, they could alternatively be formed with a damascene technique. For example, with respect to the dielectric layer from which the sections 67–69 are formed, the dielectric layer could be initially etched so as to define trenches where the conductive sections 72–73 are to be located, a layer of a conductive material could be deposited so as to fill the trenches, the conductive layer could be planarized so as to remove portions thereof other than the sections 67–69 in the trenches, and then the dielectric layer could be etched again so as to leave only the portions 67–69 thereof.

Next, sidewalls 91–98 are formed on the respective side surfaces 81–88. As shown in FIG. 5, each of the sidewalls 91–98 has a lower edge which engages the top surface 13. The sidewalls 91–98 are formed using a known technique, for example by depositing a layer of an insulating material such as a nitride over the top of the is device 60, and by then doing an appropriate vertical etch so as to leave only the portions of the nitride layer which define the respective sidewalls 91–98. In the embodiment of FIGS. 4–6, the sidewalls 91–98 each have a width or thickness which is sublithographic. As mentioned above in association with the embodiments of FIGS. 1–3, known techniques allow each of the sidewalls 91–98 to be formed with very accurate control of its width or thickness, even at sublithographic dimensions.

Next, a layer 101 of a conductive material such as copper is deposited over the top of the device 60. Then, the layer 101 is planarized using a known technique, so as to remove portions thereof which are disposed above the upper ends of the sidewalls 91–98. For example, the planarization may be effected using a known CMP technique, or a known etching technique. After planarization, the resulting device is as shown in FIG. 6. In FIG. 6, the conductive sections 72–73 and 101A–101C are respective groups of lines which are interleaved and which have a high capacitive coupling between adjacent lines. The conductive sections 72–73 may carry one supply voltage, and the conductive sections 101A–101C may carry a different supply voltage. Alternatively, the conductive sections 72–73 may carry a supply voltage, and the conductive sections 101A–101C may a system ground. Since the sidewalls 92–95 each have a width or thickness which is sublithographic, the conductive sections on opposite sides of each of these sidewalls are inherently spaced from each other by a distance which is sublithographic. Further, through appropriate initial positioning of the sections 67–69 and 72–73, it would be possible for the conductive sections 101A–101D to each have a width or thickness in the horizontal direction which is sublithographic.

As to the techniques according to the invention which have been described above in association with the embodiments of FIGS. 1–6, a variation of these techniques may be used to facilitate fabrication of several transistor so that their gate structures are in close proximity to each other. This arrangement would be useful, for example, where several transistors are coupled in series, with the drain of each transistor coupled to the source of an adjacent transistor. This technique for fabricating transistors with closely spaced gate structures is described below in conjunction with FIGS. 7–11, which are each a diagrammatic sectional side view of an integrated circuit 110, and which show the integrated circuit 110 at respective successive stages during its fabrication.

The integrated circuit 110 includes a structural portion 112 which is a silicon substrate having a top surface 113. The substrate 112 has spaced regions 117 and 118 adjacent its top surface 113. Using known doping techniques, the regions 117 and 118 are doped through the top surface 113 so that the region 117 becomes a source region and the region 118 becomes a drain region. When fabrication of the device 110 is completed, the source region 117 will be at one end of the chain of series-coupled transistors, and the drain region 118 will be at the other end thereof.

After formation of the source and drain regions 117 and 118, a layer 121 of a dielectric material is formed on the upper surface 113 of the substrate 112. In the disclosed embodiment of FIGS. 7–11, the layer 121 is silicon dioxide. Thereafter, two sections 126 and 127 which serve as gate electrodes are formed at spaced locations on the layer 121. In the disclosed embodiment of FIGS. 7–11, the gate electrodes 126 and 127 are formed by depositing on top of the layer 121 a layer of suitable gate electrode material, such as a polysilicon material, and by then etching away unwanted portions of this layer using a known etching technique, thereby leaving only the portions 126 and 127. The gate electrode 126 has side surfaces 131 and 132 on opposite sides thereof, and the gate electrode 127 has side surfaces 133 and 134 on opposite sides thereof. The side surfaces 132 and 133 face toward each other.

Next, sidewalls 141 and 142 are formed on the side surfaces 131 and 132 which are located on opposite sides of the gate electrode 126, and sidewalls 143 and 144 are formed on the side surfaces 133 and 134 which are located on opposite sides of the gate electrode 127. The sidewalls 141–144 each have a lower edge which engages the upper side of the oxide layer 121. The sidewalls 141–144 are formed using a known technique, for example by depositing a layer of a nitride material over the top of the device 110, and by then doing an appropriate vertical etch so as to leave only the portions of the nitride layer which serve as the respective sidewalls 141–144. In the disclosed embodiment of FIGS. 7–11, the sidewalls 141–144 each have a width or thickness which is sublithographic. As mentioned earlier, known techniques of forming the sidewalls 141–144 permit each of these sidewalls to be formed with very accurate control of its width or thickness, even at sublithographic dimensions.

Next, a layer of dielectric material is deposited over the device 110, and is then planarized so as to remove portions thereof above the upper ends of the sidewalls 141–144. At this stage of fabrication, the device 110 is as shown in FIG. 7, where the sections 146, 147 and 148 are the portions of the dielectric layer which remain after the planarization. Sections 146–148 are made of a material which is different from the material of the sidewalls 141–144 and different from the material of the oxide layer 121, so that the sections 146–148 can be selectively etched relative to the sidewalls 141–144 and the oxide layer 121.

Figure 8:
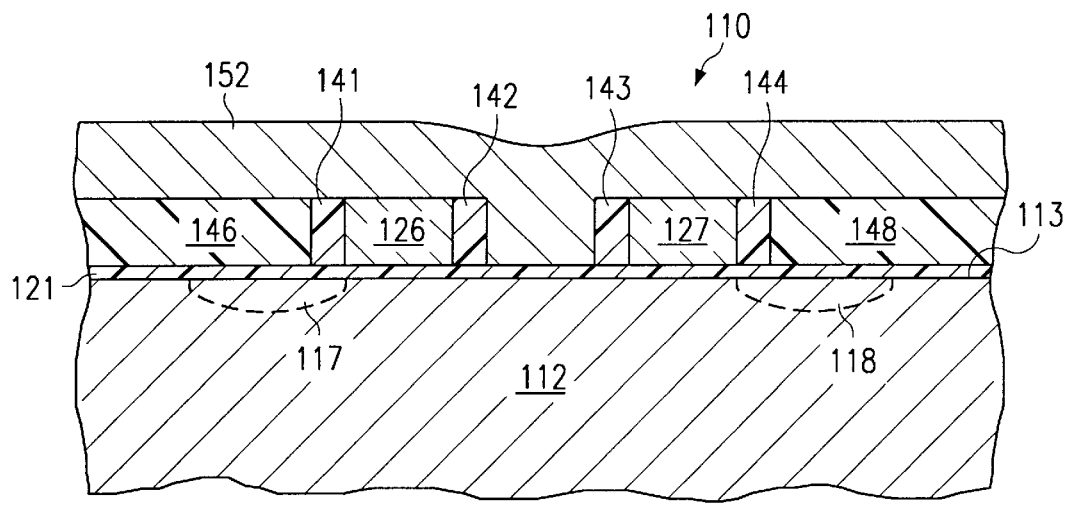
Figure 9:
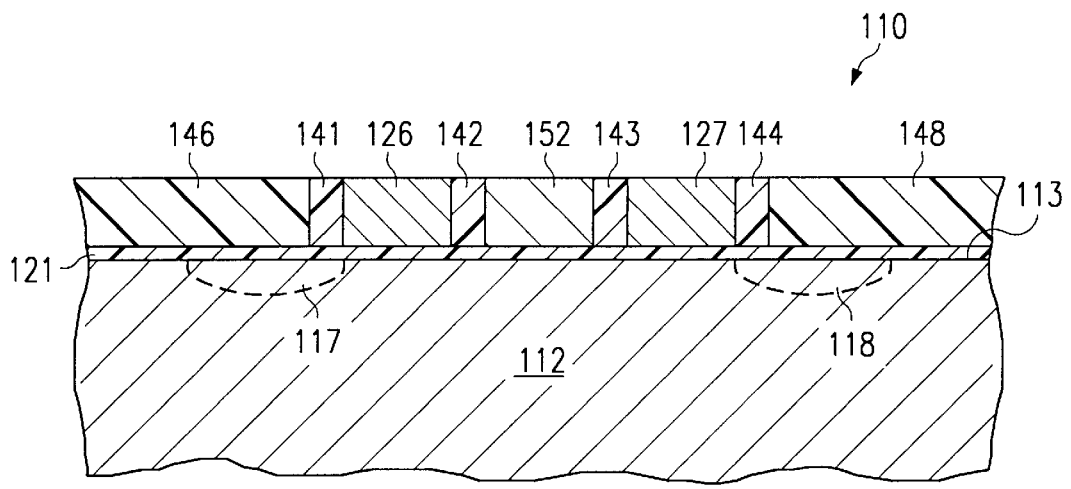

Next, a patterned etch is carried out so as to remove the section 147 of dielectric material which is between the sidewalls 142 and 143. Then, as shown in FIG. 8, a layer 152 of a material which may suitably serve as a gate electrode is deposited over the top of the device 110. The material 152 may be the same as the material used for the sections 126 and 127, such as a polysilicon material. The layer 152 is then planarized so as to remove portions thereof which are above the upper ends of the sidewalls 141–144, after which the device 110 will appear as shown in FIG. 9. The planarization may be effected using known techniques of the type discussed above, such as a CMP technique or an etching technique. As already discussed, the sidewalls 142 and 143 each have a width which is sublithographic. Consequently, in FIG. 9, the gate electrodes 126 and 152 are spaced by a distance which is sublithographic, and the gate electrodes 152 and 127 are spaced by a distance which is sublithographic.

Figure 10:
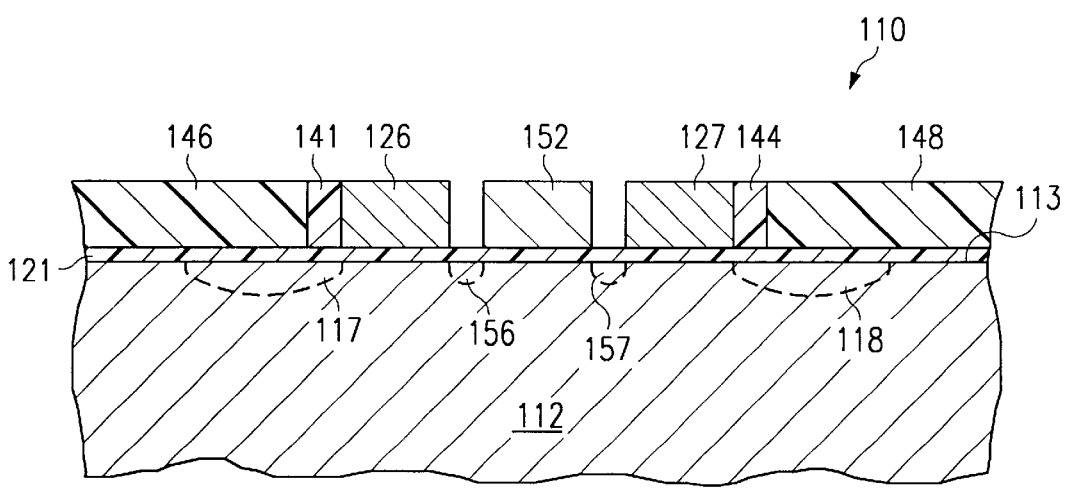

Subsequently, a patterned etch is carried out using a selective etch technique, so as to remove the material of the sidewalls 142 and 143, as shown in FIG. 10. Although only the sidewalls 142 and 143 are removed at this point in the disclosed embodiment of FIGS. 7–11, it will be recognized that, in an alternative approach, the sidewalls 141 and 144 could also be removed at this point.

Next, the substrate 112 is subjected to a doping process through the spaces or gaps created by the removal of the sidewalls 142 and 143, so as to form doped regions 156 and 157 within the substrate 112 and adjacent top surface 113. In the disclosed embodiment of FIG. 10, this doping is effected through the oxide layer 121. The doping may be carried out using a known technique to achieve what is commonly referred to as a medium doped drain implant at each of the regions 156 and 157. The doped region 156 serves as a drain region with respect to the gate electrode 126, and serves as a source region with respect to the gate electrode 152. Similarly, the doped region 157 serves as a drain region with respect to the gate electrode 152, and serves as a source region with respect to the gate electrode 127.

Although the portions of the layer 121 below the sidewalls 142–143 are not removed with the sidewalls 142–143 in the embodiment of FIGS. 7–11, it would alternatively be possible to remove these portions of the layer 121 during the etch that removes the sidewalls 142–143. In either case, once the regions 156 and 157 have been created by appropriate doping, a nitride material is deposited at 161 in the space between the gate electrodes 126 and 152, and at 162 in the space between the gate electrodes 152 and 127. When a metalization layer is subsequently formed on top of the device 110 of FIG. 11, electrical connections to the source region 117 and the drain region 118 may be created by etching a not-illustrated via opening down through each of the dielectric sections. 146 and 148 in a known manner, and then introducing a conductive material such as tungsten into each via opening in a known manner.

Also, even though the source and drain regions 117–118 in the disclosed embodiment of FIGS. 7–11 are formed before the gate structures of the transistor, it will be recognized that the source and drain regions 117–118 could alternatively be formed after the gates structures have been formed. Similarly, source and drain extensions could be formed after the gates structures have been created.

Figure 11:
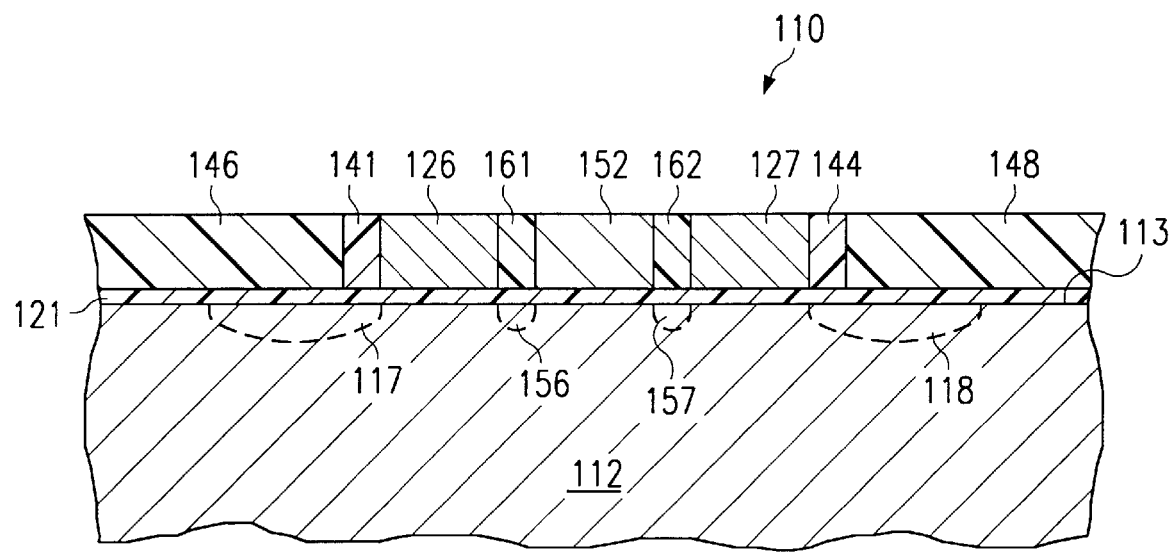
Figure 12:
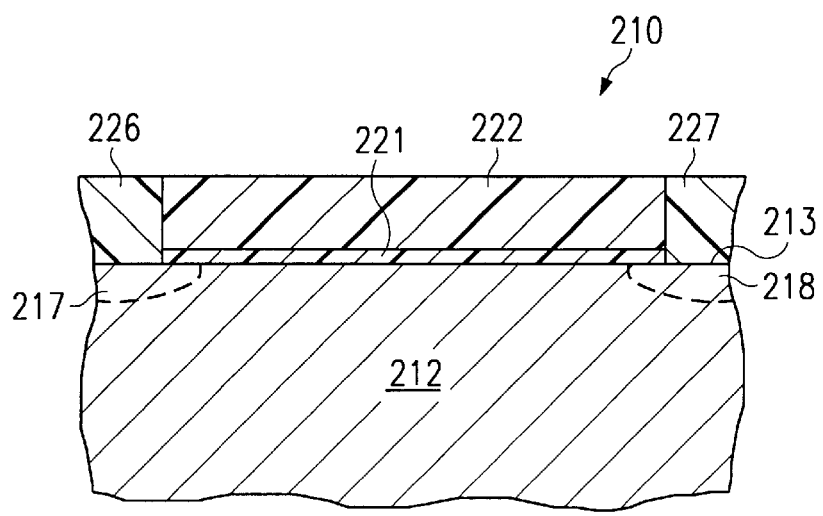
FIGS. 12–15 are diagrammatic sectional side views of an alternative embodiment of the integrated circuit of FIGS. 7–11, depicting respective successive stages during its fabrication according to an alternative form of the method utilized to fabricate the integrated circuit of FIGS. 7–11.

The series transistor structure shown in FIG. 11 has the advantage of reduced series resistance, reduced area, and reduced capacitance at the intermediate nodes between transistors. This can be advantageous in a situation involving dynamic nodes, such as a domino arrangement, where charge sharing can be a problem.

FIGS. 12–15 are each a diagrammatic sectional side view of an integrated circuit 210 which is an alternative embodiment of the integrated circuit 110 of FIGS. 7–11. FIGS. 12–15 show the integrated circuit 210 at respective successive stages during its fabrication according to a method which embodies the present invention, and which is a variation of the method discussed above in association with FIGS. 7–11.

The integrated circuit 210 includes a structural portion 212 which is a semiconductor substrate made of a silicon material, and which has a top surface 213. The substrate 212 has spaced regions 217 and 218 which are adjacent the top surface 213, and which have been doped through the top surface 213 using known techniques. The region 217 is a source region, and the region 218 is a drain region.

After formation of the source and drain regions 217 and 218, a layer 221 of silicon dioxide is grown on the top surface 213. Then, a layer 222 of a further material is deposited on top of the oxide layer 221, the layer 222 being a material different from the oxide material of layer 221, so that the material 222 can be selectively etched relative to the oxide layer 221. A patterned etch is then carried out on the layers 221 and 222, or alternatively a respective patterned etch of each layer, so as remove, portions of these layers at the left and right sides in FIG. 12, leaving only the sections of the layers 221 and 222 which are visible in FIG. 12. This patterned etching is carried out in a manner so that the opposite ends of the layers 221 and 222 overlap a small distance with the source and drain regions 217 and 218.

Next, a layer of dielectric material is deposited over the top of the device 210, and then planarized to a level corresponding to the top surface of the section 222. The planarization may be carried out using a known planarization technique of the type discussed above, such as a CMP technique or an etching technique. After planarization, the portions of the dielectric layer which remain are those shown at 226 and 227, which are on opposite sides of the sections 221 and 222. The sections 226 and 227 are made of a material which is different from that of the section 222, in order to permit the section 222 to be etched relative to the sections 226 and 227. In this regard, the next step is to selectively etch away the section 222 in FIG. 12, without etching away the sections 226, 221 and 227.

Figure 13:
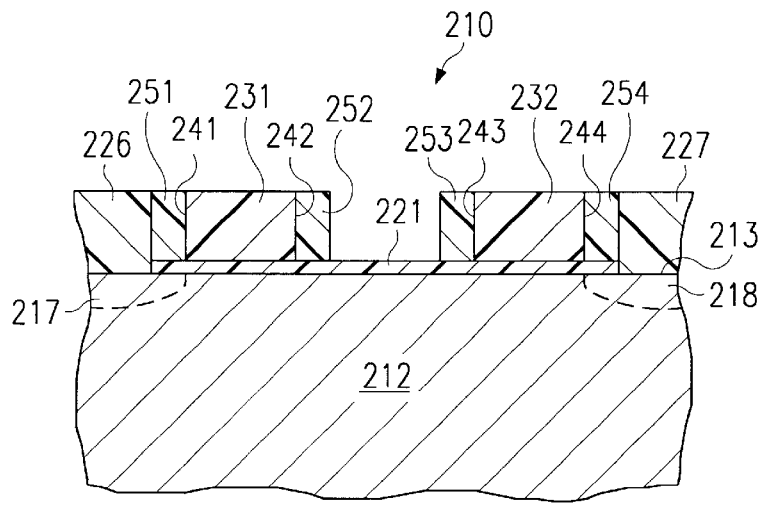

Thereafter, as shown in FIG. 13, two spaced dielectric sections 231 and 232 are formed on the oxide layer 221. In the disclosed embodiment of FIG. 13, the dielectric section 231 is spaced by a sublithographic distance from the dielectric section 226, and the dielectric section 232 is spaced by a sublithographic distance from the dielectric section 227. The dielectric sections 231 and 232 may be formed by depositing a layer of dielectric material over the top of the device 210, and then selectively etching away unwanted portions so as to leave the dielectric sections 231 and 232. The dielectric material of the sections 231 and 232 is selected so that it can be selectively etching relative to other materials of the device 210. The dielectric section 231 has side surfaces 241 and 242 on opposite sides thereof, and the dielectric section 232 has side surfaces 243 and 244 on opposite sides thereof.

Sidewalls 251–254 are then formed on the respective side surfaces 241–244, as shown in FIG. 13. The sidewall 251 fills the space between the dielectric sections 226 and 231, and the sidewall 254 fills the space between the dielectric sections 232 and 227. The sidewalls 251–254 each have a lower edge which engages the oxide layer 221. The sidewalls 251–254 are formed through use of a known technique, for example by depositing a layer of nitride material over the top of the device 10, and by then doing an appropriate patterned etch so as to leave only the portions of the material which define the respective sidewalls 251–254. In the integrated circuit 210 of FIG. 13, the sidewalls 251–254 each have a width or thickness which is sublithographic. As previously mentioned, known techniques allow each of the sidewalls 251–254 to be formed with very accurate control of its width or thickness, even at sublithographic dimensions. Following formation of the sidewalls 251–254, the device 210 appears as shown in FIG. 13.

Figure 14:
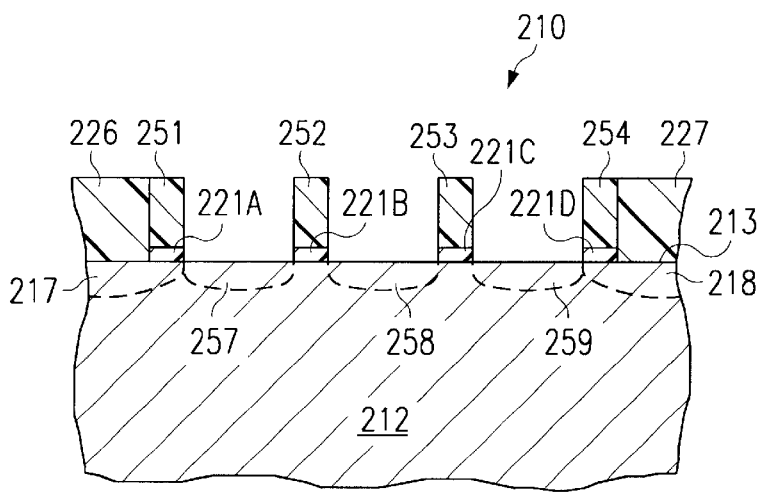

Next, a selective etch is performed so as remove the dielectric sections 231 and 232, as well as portions of the layer 221 other than the portions 221A–221D that are disposed beneath the respective sidewalls 251–254. The result is as shown in FIG. 14. Thereafter, the top surface 213 of the substrate 212 is subjected to doping through the various spaces between the sidewalls 251–254, resulting in the creation of channel regions 257–259.

Figure 15:
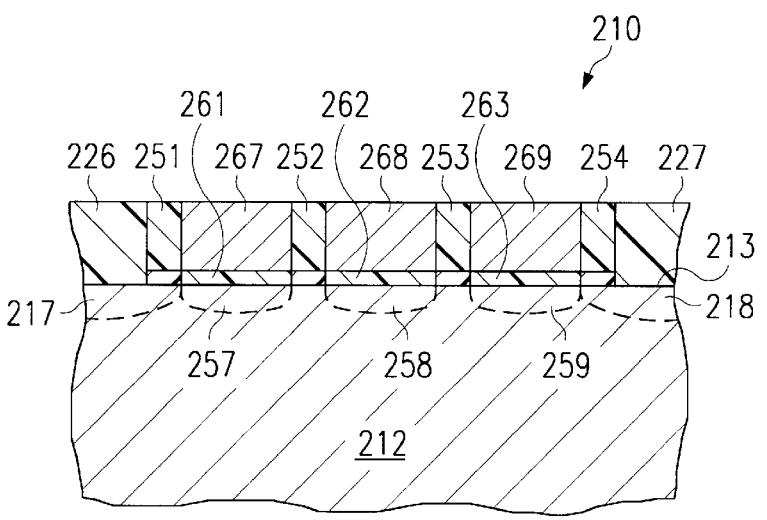

Next, and as shown in FIG. 15, layers 261–263 of silicon dioxide are grown on the top surface 213 of the substrate 212 above each of the respective channel regions 257–259. Then, respective gate electrodes 267–269 are formed on each of the respective oxide layers 261–263, for example by depositing a layer of polysilicon material on top of the device 210, and then planarizing the layer of polysilicon material so as to remove portions thereof above the upper ends of the sidewalls 251–254, leaving the portions 267–269 which are between the sidewalls and which serve as gate electrodes.

It will be noted that, in the disclosed embodiment of FIG. 15, source/drain regions have not been formed in the substrate 212 under each of the sidewalls 252 and 253. While it would optionally be possible to do so, the gate electrodes 267–268 have a sublithographic spacing between them, and the gate electrodes 268–269 also have a sublithographic spacing between them, as a result of which the integrated circuit 210 is capable of satisfactory operation without doping of the substrate so as to create a respective source/drain region beneath each of the sidewalls 252 and 253.

The present invention provides a number of technical advantages. One such technical advantage is that elements can be fabricated in an integrated circuit with spacing between them which is very small, and possibly sublithographic, without any need for close alignment considerations in the lithographic steps that are involved. There are a variety of different applications in which the techniques according to the invention can be used. One example involves the fabrication of interleaved supply voltage lines that are spaced by sublithographic distances, so as to have a high capacitive coupling between them. Another example is the fabrication of closely spaced gate structures for several transistors that are coupled in series. In the case of series-coupled transistors, the close spacing reduces series resistance, and also reduces capacitance at nodes between the transistors. A further advantage is that, in virtually all applications to which the invention is applied, the close spacing achieved between elements results in a reduction of the overall area required on the integrated circuit for these elements.

Although selected embodiments have been illustrated and described in detail, it should be understood that these are merely exemplary, and that there are a variety of other applications in which the techniques of the present invention can be applied. Thus, variations are possible without departing from the spirit and scope of the present invention, as defined by the following claims.

What is claimed is:

1. A method of fabricating an integrated circuit, comprising the steps of:

providing a structure having a top surface and including a semiconductor substrate;

forming spaced first and second sections on said top surface, said first and second sections respectively having first and second side surfaces which face each other;

forming a first sidewall on said firs side surface;

forming a second sidewall on said second side surface;

forming a third section between said first and second sidewalls, including the steps of introducing a selected material between said first and second sidewalls, and removing any portion of said selected material which is higher than upper ends of said first and second sidewalls;

wherein said steps of forming said first, second and third sections include the step of forming each of said first, second and third sections as a transistor gate structure; and including after said step of forming said third section, the steps of removing said first and second sidewalls, leaving a first opening between said first and third sections and a second opening between said second and third sections, doping regions of said structure through the first and second openings, and filling up the first and second openings with an insulating material.

2. A method according to claim 1, wherein said steps of forming said first and second sidewalls are carried out so that said first and second sidewalls each have a thickness which is sublithographic, the distance between said first and third sections thus being sublithographic, and the distance between said second and third sections thus being sublithographic.

3. A method according to claim 1, wherein said steps of forming said first and second sections and said first and second sidewalls are carried out so that a distance between said first and second sidewalls, and thus the width of said third section, is sublithographic.

4. A method according to claim 1, wherein said step of introducing said selected material is carried out using a deposition procedure; and wherein said removing step includes a planarization procedure.

5. A method according to claim 1, wherein said step of providing said structure with said top surface includes the step of providing a thin gate dielectric layer on a surface of said substrate, said gate dielectric layer having said top surface thereon on a side thereof opposite from said substrate.

6. A method according to claim 1, wherein said top surface is on said semiconductor substrate; and wherein said steps of forming said first, second and third sections include for each of said first, second and third sections the steps of forming an oxide layer on said top surface, and thereafter forming a gate electrode on said oxide layer.

7. A method of fabricating an integrated circuit, comprising the steps of:

provideing a structure having a top surface;

forming spaced first and second sections on said top surface, said first and second sections respectively having first and second side surfaces which face each other;

forming a first sidewall on said first side surface;

forming a second sidewall on said second side surface; and forming a third section between said first and second sidewalls, including the steps of introducing a selected material between said first and second sidewalls, and removing any portion of said selected material which is higher than upper ends of said first and second sidewalls;

wherein said structure with said top surface includes a semiconductor substrate having first, second and third channel regions which are respectively below said first, second and third sections;

including after said step of forming said second sidewall, and prior to said step of forming said third section, the steps of removing-said first and second sections and doping said first, second and third channel regions of said substrate; and including after said doping step the steps of forming a fourth section on a side of said first sidewall remote from said second sidewall, and forming a fifth section on a side of said second sidewall remote from said first sidewall.

8. A method according to claim 7, wherein said steps of forming said third, fourth and fifth sections include for each of said third, fourth and fifth sections the steps of forming an oxide layer on said top surface, and thereafter forming a gate electrode on said oxide layer.

* * * * *